United States Patent
Crawford et al.

(10) Patent No.: US 8,184,670 B2
(45) Date of Patent: May 22, 2012

(54) SMART LINEAR PULSED LASER DIODE DRIVER, AND METHOD

(75) Inventors: Ian D. Crawford, Longwood, FL (US); John A. Harwick, Sanford, FL (US); Timothy M Ayres, Orlando, FL (US)

(73) Assignee: Analog Modules, Inc., Longwood, FL (US)

( * ) Notice: Subject to any disclaimer, the term of this patent is extended or adjusted under 35 U.S.C. 154(b) by 0 days.

(21) Appl. No.: 12/900,453

(22) Filed: Oct. 7, 2010

(65) Prior Publication Data

US 2011/0085576 A1 Apr. 14, 2011

Related U.S. Application Data

(60) Provisional application No. 61/250,065, filed on Oct. 9, 2009.

(51) Int. Cl.
*H01S 3/00* (2006.01)
*H01S 3/13* (2006.01)
(52) U.S. Cl. .................. 372/38.02; 372/38.01; 372/30
(58) Field of Classification Search ...... 372/38.1–38.02, 372/38.04, 38.07, 30
See application file for complete search history.

(56) References Cited

U.S. PATENT DOCUMENTS

| | | | |
|---|---|---|---|
| 5,311,353 A | 5/1994 | Crawford | |
| 5,350,134 A | 9/1994 | Crawford | |
| 6,646,479 B1 | 11/2003 | Crawford | |
| 6,650,404 B1 | 11/2003 | Crawford | |
| 6,697,402 B2 | 2/2004 | Crawford | |
| 7,262,584 B2 | 8/2007 | Crawford | |
| 7,348,948 B2 | 3/2008 | Crawford | |
| 7,756,173 B2 | 7/2010 | Alfrey | |
| 2003/0016711 A1* | 1/2003 | Crawford | 372/38.02 |
| 2006/0291512 A1* | 12/2006 | Borschowa | 372/38.02 |
| 2010/0002732 A1* | 1/2010 | Tidemand-Lichtenberg | 372/12 |
| 2010/0091807 A1* | 4/2010 | Deppe et al. | 372/38.04 |

OTHER PUBLICATIONS 771 data sheet Analog Modules, Inc 2 pages.
775 data sheet Analog Modules, Inc 2 pages.
778 data sheet Analog Modules, Inc 2 pages.
Opamp Current Source eCircuit Center 5 pages http://www.ecircuitcenter.com/Circuits/curr_src1/curr_src1.htm.

* cited by examiner

*Primary Examiner* — Jessica Stultz
*Assistant Examiner* — Phillip Nguyen
(74) *Attorney, Agent, or Firm* — Gerald E. Linden

(57) ABSTRACT

In a pulsed laser diode driver an energy storage capacitor is continuously being charged to a supply voltage Vr. When a pulse is initiated, energy stored in the capacitor is delivered to the laser diode load. The capacitor voltage Vd at the end of a pulse is used to control Vr to ensure that Vd is maintained above a minimum voltage Vm required to ensure operation of a current control device (such as FET) just above saturation. Test pulses (such as with attenuated currents or reduced pulsewidth) may be fired to determine an initial optimum value for Vr. After a test pulse, a slightly high estimate for Vr may be used and may be iterated (incremented) down to an optimum value Vm during a firing burst. A digital processor may be used to calculate and store data to optimize the performance. Various embodiments are disclosed.

17 Claims, 2 Drawing Sheets

SMART LINEAR PULSED LASER DIODE DRIVER, AND METHOD

CROSS-REFERENCE TO RELATED APPLICATIONS

This is a non-provisional filing of provisional No. 61/250,065 filed Oct. 9, 2009.

TECHNICAL FIELD OF THE INVENTION

The invention relates generally to current drivers, more particularly pulsed or variable waveform diode (such as laser or LED) drivers and methods of operation.

BACKGROUND OF THE INVENTION

A pulsed current source such as the Analog Modules Model 771 or 778 laser diode drivers may be used to drive a single or stack of laser or light emitting diodes. However, this can be inefficient and dissipative because a storage capacitor bank needs to be charged to a voltage substantially higher than the laser diode voltage requirement. Nevertheless, drawing the laser current from a storage capacitor bank rather than from a power supply and filter may be beneficial because a power supply would have to be rated at a large power to supply the diode current. There is also a difficulty in maintaining regulation in a power supply over the range of pulse current draw required, zero to maximum diode current.

The Model 771 incorporated a variac to manually set this voltage. A power supply charges up the storage capacitor, or multiple capacitors (bank), to a regulated voltage level between laser pulses and a current control device such as an FET (field effect transistor) is used to regulate the current, in conjunction with a current sensing device. The factors that require this higher regulated bank voltage may include the following (any of which may be referred to as "losses"):

- droop in the storage capacitor voltage during the pulsed discharge;
- ESR (equivalent series resistance) losses in the storage capacitor during the discharge;
- ohmic loss across the current control device, FET, or current control transistor;
- loss in the current sensor which measures the current flow;
- capacitor value initial tolerance and end of life allowance;
- temperature effects on capacitor value, ESR, and other component parameters; and
- variations in pulse width required (without the current control device saturating).

When supplying power from the storage capacitor(s) to the load (such as laser or light emitting diodes), particularly in a pulsed-mode operation, the voltage in the storage capacitor(s) will droop during the current pulse but must always be adequate to power the current control device without saturation otherwise the required current will fall at the end of the pulse.

For the above reasons, the storage capacitor is typically charged 5 to 10 volts above the laser diode required voltage with a significant dissipation occurring in the current control device determined by the instantaneous excess voltage times the current flow. This dissipation causes this design to be inefficient and limited by the safe forward operating conditions of the control device. Each laser diode has a voltage of about 2.5 volts, but frequently multiple diodes are connected in series to generate more laser power. This configuration requires a higher drive voltage for the correct current.

U.S. Pat. No. 7,262,584 discloses efficient fast pulsed laser or light-emitting diode driver. A capacitor connected to the output of a multiphase power converter, and a current-driven device (e.g., LED or laser diode) is also connected to the power converter output. A solid state switch (FET or IGBT) is connected in series with the current-driven device. Means are provided for sensing current through the current-driven device. An error amplifier compares sensed current through the current-driven device with a current level demand signal and controls the output of the power converter. Means are provided for turning the switch on and off and may be (i) a fast comparator receiving a voltage reference signal at one input and the current level demand signal at another input, and outputting the switch on/off signal to the switch or (ii) an externally-generated logic signal provided directly to the switch.

U.S. Pat. No. 7,756,173 discloses laser diode driver with adaptive compliance voltage. A laser diode driver with means for adjusting the compliance voltage to allow a current source to accurately reproduce a current command while simultaneously minimizing the power dissipation of the current source. For a slowly-varying or DC current command, the compliance voltage is continuously adjusted to limit the power dissipation of the current source to below a predetermined minimum. For a pulsed current waveform, the compliance voltage is maximized during periods of zero or low current demand so that sufficient energy is stored to faithfully reproduce the leading edge of a pulsed current command, and reduced during the plateau portion of a pulsed current command to minimize the power dissipation of the current source.

BRIEF DESCRIPTION (SUMMARY) OF THE INVENTION

Generally, the invention is directed to a technique for automatically minimizing the above-referenced losses, thereby allowing for higher efficiency, smaller size, and greater reliability.

More specifically, some objects of the present invention are reducing demand on a power source such as a battery and minimizing power dissipation in the current control device of a pulsed laser (or LED) diode driver.

According to the invention, generally, in a pulsed laser diode driver a storage capacitor is continuously being charged to a supply voltage Vr. When a pulse is initiated, energy stored in the capacitor is delivered to the laser diode load. At the beginning of the pulse, the capacitor voltage (Vc) equals Vr. During the pulse, the capacitor voltage drops from ESR losses and energy losses, and at the end of the pulse the lowest capacitor voltage is Vd. Operating conditions, such as the supply voltage Vr are controlled to ensure that Vd is maintained above a minimum voltage Vm required to ensure operation of a current control device (such as FET) just above saturation. Test pulses (such as with attenuated currents or reduced pulsewidth) can be fired to determine an initial optimum value for Vr. After a test pulse, a slightly high estimate for Vr may be used and may be iterated (incremented) down to an optimum value Vm during a firing burst. A digital processor may be used to calculate and store data to optimize the performance and speed up the setting process. Various embodiments are disclosed.

Basically, the difference between the capacitor voltage and what the diode needs is dissipated in the current control device (FET). According to a feature of the invention, the capacitor voltage may be automatically adjusted so that the current control device is almost saturated at the end of the pulse. This minimizes dissipation in current control device (FET).

According to an embodiment of the invention, a method of operating a load which is laser or light emitting diodes in a pulse mode with a diode driver comprises: providing a storage capacitor; providing a power supply receiving input power and providing output power for charging the storage capacitor to a capacitor bank voltage (Vr); providing a current sense device, having an output providing a current sense signal indicative of a current flowing through the load; providing a current control device for controlling the current flowing through the load in response to a current control signal; providing a controller having inputs for capacitor bank voltage (Vr) and the current sense signal, and outputting the current control signal, and the controller further has a voltage set output for setting the bank voltage (Vr) output by the power supply; and with the controller, adjusting the power supply voltage to ensure minimum voltage by automatically adjusting the capacitor bank voltage (Vr) so that the current control device is almost saturated at the end of the pulse thus minimizing its dissipation. At least one precursor pulse or pulses may be generated to determine a correct initial storage capacitor bank voltage (Vr). Conditions of a last, prior, or test pulses may be stored to allow a rapid setting of the correct capacitor bank voltage (Vr). The laser may be a Q switched laser and a single short pulse output of the laser may be detected with a photodiode, and information about the pulse may be fed back to the controller. Current flowing through the load may be shut down at the time of the short pulse. One or more of the power supply voltage and current and pulse width to may be scaled back to optimize the overall efficiency. The diode driver may be used to pump a non electro-optically Q switched laser and the current may be increased at a predetermined time to enhance the probability of the laser firing within a predetermined desired time bracket.

According to an embodiment of the invention, a driver for providing pulsed power to a load comprising laser diodes or LEDs, the driver comprises: a storage capacitor that provides the primary energy for the pulse; a power supply receiving input power and providing output power for charging the storage capacitor to a predetermined capacitor bank voltage (Vr); a current sense device, having an output providing a current sense signal indicative of a current flowing through the load; a current control device for controlling the current flowing through the load in response to a current control signal; and a controller having inputs for the capacitor bank voltage (Vr) and the current sense signal, and outputting the current control signal (Control V), and the controller further has an output (voltage set) for adjusting the power supply voltage to ensure minimum voltage across the current control device at the end of a pulse and minimize its dissipation. The current sense device (or means for sensing current) may comprise a resistor connected between the load and ground. The controller may include a digital signal processor (DSP). The current control device may comprise a FET. The load is connected to the storage capacitor; the current sense device is connected to ground; and the current control device is connected between the load and the current sense device. The power supply may be a programmable power supply. The driver may further comprise a temperature sensor for measuring temperature and providing a signal to the controller to make a feed-forward adjustment to allow a more rapid setting of a correct voltage with lower instantaneous peak power in the current control device. The current sense device may comprise a photodetector detecting light emitted by the load. The power supply may comprise a boost converter for boosting input voltage to a voltage higher than input power; a high voltage capacitor for storing the high voltage; and a buck converter for charging the former storage capacitor. The DSP may be used to control the switching of the power supply, including the boost converter and the buck converter. The DSP may be used for setting the current, pulse width and pulse repetition frequency.

The current sensing device may comprise a resistor, a hall-effect sensor, current transformer or other means for current sensing and providing the current sense signal such as means for sensing current within the FET.

The above-referenced U.S. Pat. No. 7,262,584 shows a saturating switch with an adjustable power supply to set the correct operating voltage, and uses a fast responding power source to supply the required current. The present invention is different than the patent in that it is the storage capacitor that provides all of the current needed by the laser diode during the pulse, not the power supply, and it uses a current source instead of a saturating switch. This enables the use of a very low average power output power supply, such as may be needed to run from batteries.

The above-referenced U.S. Pat. No. 7,756,173 patent tries to modify the voltage of a controlled power supply to achieve a fast risetime by maximizing the power supply voltage during off periods, and by controlling the dissipation of the MOSFET in the current source during extended operation. Some applications such as printing need a fast risetime with a substantial and variable duty cycle.

In U.S. Pat. No. 7,756,173 the load is operated directly (driven) from the power supply, which means that the power supply has to be large enough to supply peak power. In the present invention, the load is driven by the storage capacitor(s), so the power supply need only supply average current that may be orders of magnitude less.

In contrast with U.S. Pat. No. 7,756,173, the present invention is directed towards the generation of a high value current pulse at a low repetition rate, that is, a low duty cycle. The present invention is tailored to supply a pulse (or a stream of pulses) to a laser diode pumping a solid state laser. A fast rise time is generally not desirable in these applications because with the high currents required, typically 100 to 200 amps, a spike due to the inductance of the laser diode and wiring can damage the expensive laser diodes. Secondly, size and weight are a prime concern in portable laser designators and rangefinders, and the ability of the power source (likely batteries) and power supply to supply 200 amps is problematic due to massive "i squared R" losses.

It is an object of the present invention to reduce power supply requirements by using a capacitor to store the required energy for a laser pulse, and to intelligently set the optimum initial charge voltage from a low current power source. A further improvement shows how the energy may be stored at a higher voltage to reduce the size of the storage capacitance.

The present invention is well suited to driving pulsed loads, such as laser diodes. Operating the laser(s) from a storage capacitor reduces the demand on the power supply, which can be batteries. A typical operating profile for operating pulsed lasers may be charge the storage capacitor for 50 ms and discharge into the laser in 200 μs. Since the charge time is much greater than the discharge time, the power supply can be much smaller since it need only provide average current (power).

In the present invention the power supply voltage is typically controlled simply to set the initial (over) voltage for the storage capacitor.

Current sensing is performed differently in the present invention than in U.S. Pat. No. 7,756,173. In U.S. Pat. No.

7,756,173 the current sense resistor is not at ground, therefore a differential amplifier with closely toleranced components must be used to generate the current sense signal. In the present invention, the current sense resistor is typically connected to ground, thereby obviating the need for a differential amplifier. (The voltage at the ungrounded terminal of the current sense resistor is referenced to ground.)

In U.S. Pat. No. 7,756,173 the control circuit monitors the power dissipation (voltage across current control device× current) and adjusts said output voltage to maintain the power dissipation of the controlled current source at a safe limit The dissipation is used to control the loop. The goal is to have the highest possible voltage for fast rise time without overheating the FET.

The present invention monitors capacitor voltage (Vc), before (Vr) and after (Vd) a pulse (including within a stream or burst of pulses).

In the present invention, substantially all of the short term energy (for the pulse(s)) comes from the storage capacitor, rather than from the power supply. For operating from battery power, this substantially reduces the demand on the battery.

The present invention is particularly well suited to pulsed operation with a low duty cycle, such as at least 10:1 ("off" period is ten times longer than the "on" period). By operating in pulse mode, with a low duty cycle, a much smaller battery can be used. The battery need only deliver a fraction (such as $\frac{1}{10}$, for a 10:1 duty cycle) of the current needed to operate the load. Typically, the pulse will be a rectangular wave, as shown, but other pulse profiles (shapes) are possible.

In U.S. Pat. No. 7,756,173 the goal is to have a high supply voltage for fast rise time (fast turn on) without overheating the power FET. A high supply voltage allows the current to rise more quickly as it overcomes the inductance of the load. Current I=V(available driving voltage)×T (time)/L (inductance)

In the present invention, the goal is to maintain the initial capacitor voltage at the beginning of a pulse as low as possible. The capacitor voltage Vd at the end of a pulse is monitored to establish an appropriate low initial capacitor voltage Vr for the next pulse. This (keeping Vr as low as possible) also helps protect the current control device (FET) and minimize heat dissipation by the current control device, thus improving efficiency. Fast rise time is not a goal of the present invention as a YAG or solid state laser being pumped typically needs hundreds of microseconds of light duration. Rather, efficiency, small size, good battery life and protecting the current control device are the goals.

Other objects, features and advantages of the invention will become apparent in light of the following description(s) thereof.

BRIEF DESCRIPTION OF THE DRAWINGS

The structure, operation, and advantages of the present preferred embodiment of the invention will become further apparent upon consideration of the descriptions set forth herein, taken in conjunction with the accompanying figures (FIGs). The figures (FIGs) are intended to be illustrative, not limiting. Although the invention is generally described in the context of these preferred embodiments, it should be understood that it is not intended to limit the scope of the invention to these particular embodiments.

DETAILED DESCRIPTION OF THE INVENTION

Figure 1:
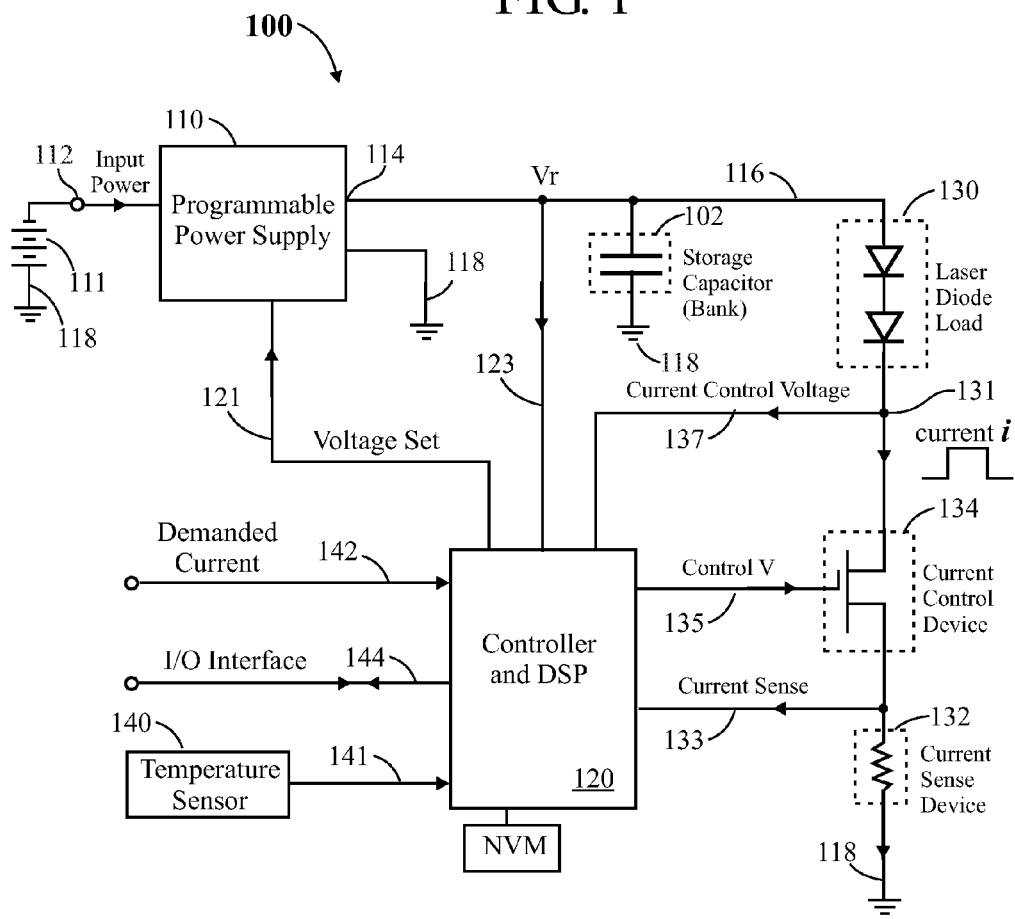
FIG. 1 is a diagram of an embodiment of a smart Laser Diode Driver, according to the invention.

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and there is a dot at the intersection of the two lines are connected with one another, else (if there is no dot at the intersection) they are typically not connected with one another.

In the drawings accompanying the description that follows, both reference numerals and legends (labels, text descriptions) may be used to identify elements. If legends are provided, they are intended merely as an aid to the reader, and should not in any way be interpreted as limiting.

FIG. 1 illustrates an exemplary embodiment of a "smart" linear pulsed laser diode driver 100. A method of operating the driver 100 will be discussed in the context of the illustrated embodiment.

The load for the driver 100 will typically be one or more laser diodes or light emitting diodes (LEDs). In the main hereinafter, laser diodes will be discussed and when laser diodes are referenced, this should be taken to include LEDs.

The driver 100 is tailored to operate the load with pulses (rather than continuously). Generally, a storage capacitor is constantly being charged by a power supply. A current control device is switched on to start the pulse, and is switched off to stop the pulse.

Major components of the driver 100 may include:
  a voltage-programmable DC charging power supply 110 having an input 112 for receiving power such as 12 V such as from a battery power source 111, and an output 114 for providing an output voltage (Vr) on a supply line 116;
  a storage capacitor (or bank of capacitors) 102 is connected between the supply line 116 and ground 118 (or power supply return);
  a controller and digital signal processor (DSP) 120 receiving various inputs and providing various outputs, as described below.

A load 130 (which does not form part of the driver, per se) such as a plurality (or array) of series-connected laser diodes may be operated by the driver 100.

In order to control operation of the load 130, in addition to the elements (such as controller 120) recited above, the driver 100 may further comprise:
  a current sensing device 132, such as a resistor, hall-effect sensor, current transformer or other means for current sensing such as sensing within the FET;
  a current control device 134, such as a bipolar transistor, or preferably a Field Effect Transistor (FET) as shown.

The load 130 will typically be a current driven device(s) such as laser diodes, and may be driven with a series (sequence) of pulses, each of the pulses having a desired duration such as 200 microseconds and a voltage such as 5 volts as required by the V-I characteristics of the laser diodes, there also being a pulse repetition rate such as 20 pps (pulses per second).

The load 130 is shown connected to the supply line 116 (which is also to the capacitor 102), and current returns via ground 118. More particularly, a first end (terminal) of the load 130 (which has two terminals) is connected to the supply line 116. The current sensing device 132 and current control device 134 are connected, in series, between a second end (terminal) of the load 130 and ground 118, as illustrated.

The "order" of current sensing and current controlling devices can be reversed as well as that of the laser diode as long as all the devices are in series. However, it is advantageous to have the current sense device 132 connected to ground if it is non-isolated (such as a resistor) as there is no common mode voltage to deal with. An N type enhancement FET is preferred for the current control device 134 as this is readily available with low ON resistances, for example FDP036N10A is 100V, 176 amp and only 3.6 milliohms.

A current "i" flowing through the load 130 may be sensed by the Current Sense device 132. This current may be used as feedback information to control the current through the load by a closed loop controller 120 to maintain regulation to the demanded current on line 142. The Demanded Current 142 is scaled to the same volts per amp as the Current Sense input 133, and then is compared to the current sense value with an error amplifier (in the controller, not shown). The output of the error amplifier modulates the Control V output 135 to the current control device 134 so that the Current Sense 133 is identical to the Demanded Current 142 in a typical control loop fashion. See for example "Current Source with Floating Load" (OpAmp Current Source) or Analog Modules Model 775 voltage to current converter of 1987, both of which are incorporated by reference herein. Of course if the demanded current goes to zero, then the Current Sense voltage 133 is set to zero by the control loop and no current flows in the laser diode load.

According to a feature of the invention, the capacitor voltage may be automatically adjusted so that the current control device 134 is almost saturated at the end of the pulse. The initial stored voltage Vr on the capacitor 114 at time to is therefore as low as it can be while still maintaining current regulation at the end of the pulse, and therefore the losses and dissipation in the current control device 134 may be minimized.

Figure 2:
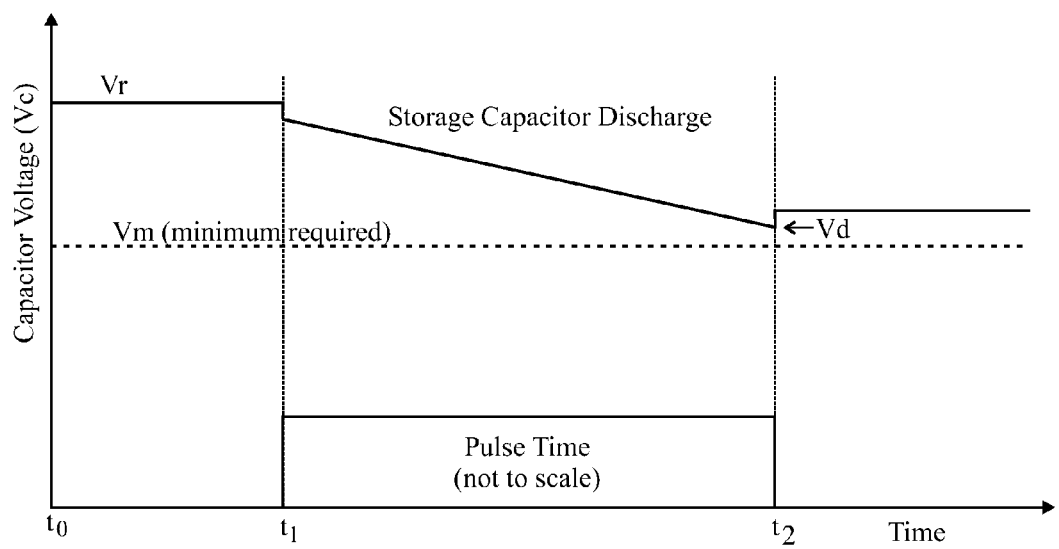
FIG. 2 is a diagram of some waveforms in the Laser Diode Driver of FIG. 1.

FIG. 2 shows capacitor voltage Vc versus time. An initial voltage Vr is stored on the capacitor 102, preceding a pulse. The beginning of a pulse is at t1, the end of a pulse is at t2. At and before t1, Vc=Vr. Initially at t1, the voltage falls sharply due to the voltage loss in the ESR of the capacitor 102. During the time between t1 and t2, current is being driven through the load, and the capacitor voltage Vc droops. At the end of the pulse t2, the capacitor voltage is shown as Vd (Vd<Vr). When the current stops, the voltage recovers the ESD loss quickly and then starts to recharge to Vr. According to a feature of the invention, Vd is maintained to always be slightly above a minimum voltage Vm required for current regulation without saturation of the Current Control Device 134. The minimum voltage Vd is monitored by the Current Control Voltage 137 and is set into the DSP 120. The pulse time is shown (but the pulse's magnitude is not to scale, for illustrative clarity).

Generally speaking, Vd is controlled by setting an appropriate Vr. An initial Vr may be predicted from open loop data (temperature, etc.) and then adjusted down using an iterative process to a safe value just above the minimum needed for regulation, Vm. An initial test pulse may be fired to collect data pertaining to the response of the laser, and used to generate a more accurate initial Vr for the next (actual) firing.

At least one precursor pulse or pulses may be generated to determine a correct initial storage capacitor bank voltage Vr by measuring Vr and the Current Control Voltage 131 at a known current, possibly lower than to be used, thus determining the laser diode voltage drop and storage capacitor ESR drop under a known current load. By correcting this data to the desired operating conditions, the correct initial storage capacitor bank voltage Vr may be set quickly.

The calculations and predictions needed to accomplish automatic adjustment of capacitor voltage Vr may be facilitated by the availability of powerful miniature digital processing devices (DSP) 120. The DSP is preferably a field programmable gate array (FPGA) with non-volatile memory, A-D and D-A converters. Information may be entered into the DSP 120 such as temperature, pulse width, demanded current, storage capacitor value, laser diode voltage and information such as Vd from a prior pulse or test firing. Nominal and acceptable range of device parameters may readily be stored in the DSP. Known changes in input pulsewidth may be directly converted into changes in Vr using geometrical calculations, simple mathematical functions, or look up tables as is familiar to those skilled in the art.

The controller may predict over-limit conditions in advance such as over-power, over-temperature (given ambient and calculated temperature rise), and high diode output, etc. Preventative predictions could be made.

From these parameters, an initial, more than adequate capacitor voltage may be predicted and a demanded voltage may be generated by a D-A (digital-to-analog) converter within the DSP from a set of preprogrammed input conditions such as expected Laser Diode Load voltage, and expected losses in the Current Sense Device 132 and the Current Control Device 134. The anticipated required voltage Vr is sent scaled as a Voltage Set signal 121 to the power supply to set the storage capacitor voltage Vr. This voltage Vr may be adjusted so that at the end of the pulse, the voltage difference between the storage capacitor end of discharge voltage Vd (see FIG. 2) and the laser diode load may be just (slightly) greater than the saturation voltage of the control transistor plus the voltage drop across the Current Sense Device 132. The ESD loss is a function of temperature and measurement of temperature and correction for this voltage drop is an important feature.

Safety circuits may be provided by measuring the voltage across the current control device 134 using the Current Control Voltage 137 and multiplying this value by the current "i" flowing, less the known drop across the current sense device 132. If this total power exceeds a safe value for the current control transistor (134), then the pulse may be truncated to avoid damage to the control transistor, and the storage capacitor voltage (Cv) may be reduced incrementally until the above conditions are met.

When the pulse is truncated, the voltage at 137 is measured and compared to the internally stored desired value. The error may be used to adjust the capacitor bank voltage Vr for the next pulse and the process repeated to make the final voltage of 137 correct at the end of the pulse. The correct value of Vr used may be corrected before the next pulse if the conditions change in a known manner. For example, if the pulse width is known as going to be increased, a higher value of Vr for the upcoming pulse may be set based on calculations of the dependence or a look up table that is preferred if the interdependence is complex.

Generally, a Vr which is initially too high will cause some extra dissipation in the current control device, but the situation should be "self correcting" after a few pulses, as Vr is reduced. Given that there will normally be a stream of pulses, the controller 120 may be programmed to reduce Vr in a few steps (corresponding to a few pulses), to ensure that Vd does not overshoot Vm. Generally, to err on the side of higher than required Vr will only result in a temporary increase in dissipation. On the other hand, a low Vt may result in a failure to deliver current at the end (reduction). If Vr is too low, there will not be enough voltage to regulate the current, and the FET 134 may become saturated (Vd<Vm).

Demanded Current Loop

An analog input for Demanded Current 142 voltage and time may be used with a purely analog feedback loop as described in a previous paragraph or in FIG. 1 of U.S. Pat. No. 7,262,584. In this case, the demanded current signal input on line 142 may be set by a potentiometer, fixed resistor, or external voltage of rectangular or random waveform (not shown). One of ordinary skill in the art will understand that a mixture of DSP and discrete analog or external control may be used to provide the demanded current input signal on 142. The demanded current signal input on line 142 will typically be an analog input waveform which may be digitized by an A-D converter (in the controller 120) along with the Current Sense signal on 133, and difference used by means of digital subtraction and gain of the error value, to generate the current control signal (Control V, line 135) signal using a D-A conversion (within the controller), or combinations of an analog and digital control loop may be used.

The current pulse width may be set by the input shape of the demanded current signal 142, but may be preferably controlled by or through the DSP 120 so that pulse truncation may occur rapidly to protect the laser diode and/or control transistor in the event of an over-current or over-voltage situation. All control is preferably through the DSP so that its available predictive and control power can be used to the fullest extent. Even if a wholly analog current control loop is used, the DSP may intervene by forcing the current control signal (Control V, line 135) to be zero in the event of a shutdown required.

Another approach is that the demanded current 142 may be a value representing the current (magnitude) only with the pulse timing (ON/OFF) as separate signal to the DSP acting as a AND gate. Such a scheme (separating magnitude and timing) would be well suited to generating rectangular pulses. The I/O Interface 144 may incorporate serial or parallel data values for current and/or timing, and the storing of operating parameters to be used by the DSP.

Optimum Control

A primary purpose of the DSP is to optimize the performance of the laser diode driver by reducing the dissipation in the Current Control Device 134. This improves efficiency resulting in a smaller heat sink and improves reliability by operating well within the Safe Operating Area Rating (SOAR). This is achieved by adjusting the lowest (normally at the end of the pulse) Current Control Voltage 137 to a preset value stored in the DSP based on the expected currents and device properties, just above saturation of the Current Control Device 134 by means of the Voltage Set 121. This adjustment is made by changing the Vr as described above.

The correct settings for Vr may be determined (for example) with a software algorithm/look up table that first takes the initial and externally applied parameters, then sets a safe but close value of value of Vr voltage estimating a Vd value above the minimum required Vm, analyses a first pulse shot, and then makes appropriate corrections, (FIG. 2). The final values may be stored in a non-volatile memory (NVM) in preparation for the next use. Feed forward adjustments may be made prior to the next firing (for example, for temperature corrections). The algorithm is geared to setting the correct voltage (Vr) as safely and rapidly as possible to avoid any low or missed current pulses. The input pulsewidth (142) is a key parameter to effect a change in Vr. Narrow pulses cause less droop ($\Delta V=it/C$ where t is the pulsewidth) allowing a lower Vr.

If desired, the DSP may initiate a "test firing", possibly at a lower current, to help determine the correct value of Vr to allow rapid iteration to the desired Vd.

This "smart" approach may also facilitate protection of the laser diode by monitoring the laser diode instantaneous voltage (Vr minus the current control voltage on 137) and truncating the pulse in the event of an extended or excessive current. The instantaneous peak powers in the load 130 and control device 134 can be calculated and monitored knowing the current and control device voltage, shots counted, over current flagged, maintenance predicted, and other features facilitated by DSP (digital signal processing) and event storage capability. The flexibility of a digital processor (DSP) also allows various protection schemes, maintenance predictions, built in test, and record keeping to be implemented.

Non-volatile memory (NVM) may be used for storing conditions of a last, prior, or test pulses to allow a rapid setting of the correct voltage Vr in similar or other conditions such as a longer pulsewidth. These conditions may include Vr, temperature, width of the pulse, voltage drop across the load, and the like, for maintaining linearity (non-saturation).

Description of the Circuit

With reference to FIG. 1, input power flows to the power supply 110, which runs continuously to try to maintain a voltage Vr on the storage capacitor 102. As Vc droops during the pulse and Vc<Vr, the power supply 110 operates to recharge the storage capacitor 102 until it reaches the desired regulation value Vr. The output current of 110 is limited so that is takes typically the interpulse period to efficiently recharge capacitor 102 to the regulated value Vr. After that value is reached, charging may stop and Vr is maintained until the arrival of the next pulse. For the highest efficiency, the power supply 110 would take substantially the entire interpulse period to recharge and the DSP 120 may optionally control the charging rate to achieve this based on prior knowledge of the timing of the next pulse.

The value of the output-regulated voltage, Vr, is controlled by a "voltage set" input on a line 121 from the controller 130. Peak pulse current i comes out of capacitor 102 and the power supply 110 recharges the capacitor 102 typically over a (much) longer period than the pulsewidth to run at a much lower power level. For example, with a laser running at 10 pps (pulses per second) with 100 microsecond pulses, the discharge laser diode current may be 100 amps. The programmable power supply will thus have 100 milliseconds to recharge the storage capacitor at an average current of 0.1 amp.

During a pulse, the power supply continues to run, trying to get the capacitor voltage (Vc) back up to Vr. It will (of course) not succeed. The power for operating the laser load during the pulse comes substantially entirely from the capacitor 102, not from the power supply. The effect of the power supply during the pulse is substantially negligible (such as less than 10%).

The storage capacitor 102 is connected between the supply line 116 and ground 118. A first end (terminal) of the load 120 is connected to the supply line 116, hence to the storage capacitor 102. A second end (terminal) of the load 120 may be connected to a first terminal of the current control device 134, such as an FET.

The connection between the load 130 and the current control device 134 is a node 131 which provides a current control voltage on a line 137 to the controller 120. The current control device 134 receives a control voltage "V" on a line 135 from the controller 120.

A second terminal of the current control device 134 may be connected to a first terminal of a current sense device 132, such as a low value resistor. A second terminal of the current sense device 132 may be connected to the power supply return 118, shown herein as ground. The connection between the current control device 134 and the current sense device is a node which provides a current sense signal on a line 133 to the controller 120. The voltage on current sense node 133 is proportional to and a measure of the current flowing in the FET 134 and diode load 130, as negligible current flows in the control V line 135.

The first terminal of the current sense device 132 is connected (via line 133) to the controller 120, and this voltage input ("current sense") is proportional to the pulse current flowing from the capacitor 102 through the series path of the load 130 (laser diodes) and the current control device 134, and the current sense device 132 back to the second terminal of the capacitor 102 (or ground 118).

The controller 120 may also receive input signals such as from a temperature sensor 140 (on line 141), the input power voltage, the storage capacitor voltage Vc, laser diode/current control voltage (137), and external inputs such as demanded current (on line 142), repetition rate, and pulse width. The controller 120 may include non-volatile memory (NVM).

Also capacitor bank voltage 123 Vr may be regulated by the voltage set signal on the line 121 and monitored via line 123 (Vr) by the controller and DSP 120.

Line 144 is a digital interface to take advantage of the DSP in the smart controller. Data may be sent to the DSP such as current demand, pulsewidth, pulse shape, maximum duty cycle, inhibit, current control device saturation value, maximum current limit and so on. Data may be received from the DSP via the interface 144 such as temperature, power to load, built-in-test status, Vr value, laser diode voltage drop, duty cycle, hours run, maximum current demanded, and the like using values derived from inputs (such as 133) to the DSP. These input and output signals may be in a serial or parallel format. Generally serial is preferred because of the fewer wires and the powerful computing now available at low cost to process this data.

Outputs of the controller 120 include a feedback control voltage (Control V) on the line 135 to a third terminal of the current control device 134 (for example FET gate) to enable (turn on) and regulate the current.

Description of Operation

At the initial switch on (Control V to Current Control Device), the controller 120 may be programmed with values for desired current, pulse width and repetition rate. The repetition rate may be externally provided in real time by a trigger signal, or may be internally generated after an enable command. The pulse width can be programmed from an external input setting a timing counter or mono-stable, or it could be an external pulse provided in real time with a commensurate simplification of the controller. Similarly, the current amplitude may be set by an externally input digital command, a stored preset value, an analog input, or a trim pot. If the DSP does not control all these functions, then it should have knowledge of these functions using an A-D input, or it may need to fire a precursor shot or shots to analyze and establish the correct conditions and set the power supply voltage Vr appropriately. The pulse shape is set by the demanded current whether sourced digitally or by analog signal, and the control V is adjusted to make the current flowing in the current sense device 132 equal to the instantaneous demand. Typically, the pulse will be a rectangular wave, as shown, but other pulse profiles (shapes) are possible.

The power supply regulates an output voltage proportional to and as commanded by the voltage set input from the controller 120 on the line 121. The initial value may be
  set from a non-volatile memory with data from the last pulse,
  preprogrammed, or
  set from a test pulse algorithm.

The value of the voltage at node 131 at the end of the current pulse may be measured and the voltage Vr may be adjusted to make the predicted value of the voltage at the node 131 just above that of current control device 134 saturation. This desired voltage may be pre-programmed in and may be changed (for example by means of a lookup table) as a function of temperature or current. The controller (DSP) may use its inputs and data from the last pulse to predict the correct value of Vr for the next pulse, for minimum dissipation across the current control device 134.

It may be desirable to sense the temperature and make an initial open loop correction of the ESR loss in the capacitor used from a look up table. This ESR loss can be on the order of volts magnitude at low temperature.

The current sense device (132) may be in any position in series with the laser current loop, especially if an isolated device is used such as a Hall effect sensor or a transformer. With these four-terminal devices, the loop current flows through the two sensing terminals and the two measurement terminals, signal and return, are returned to the controller 120. Generally resistive sense devices are best connected to ground at one terminal to avoid having to reject a common mode voltage which may be many times larger than the voltage being measured. It is desirable that the voltage drop across the current sense device be as small as possible commensurate with accurate measurement to reduce losses.

The current waveform may be programmed by the DSP 120. For example, a controlled rise time may be desirable to reduce ringing on the load. The DSP 120 may set current steps ramping up with time to accomplish this. Other complex waveforms may be generated by modulating the current, but this is done normally with the penalty of increased dissipation in the current control device.

The laser diode load 130 typically has a temperature coefficient of 2.3 mV per degree Celsius per diode. If the number of laser diodes is known, and the diode temperature, the storage bank voltage Vr can be "corrected" to take account of the coefficient of the load. By setting the initial Vr more accurately, the peak dissipation of the current sense device will be reduced.

ALTERNATE EMBODIMENT(S)

Figure 1A:
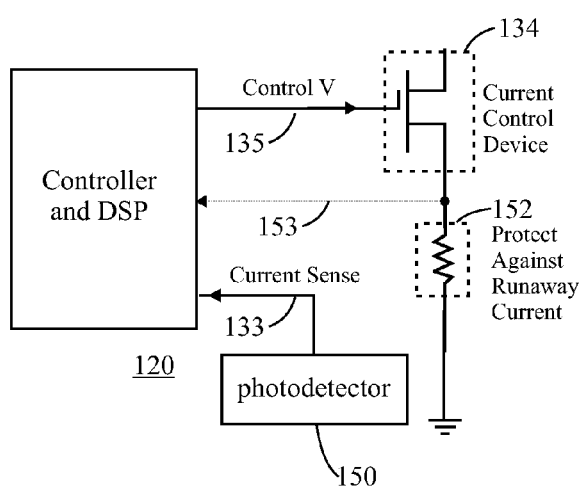
FIG. 1A is a (partial) diagram of an alternate embodiment of a smart Laser Diode Driver, according to the invention.

FIG. 1A shows that the current sense device may be "replaced" by the light from the laser as measured by a photodetector 150 (such as photodiode) and converted into a feedback voltage replacing the function of the current sense device. The "current sense" signal is of course based on light output, which varies with current, and is therefore only indirectly a current sense. It should be understood that by closing the loop based on light output by the laser, the current through the laser will adjust itself.

The current sense signal on line 133 (FIG. 1), or the "current sense" signal on line 153 represents instantaneous current flow through the load, and hence relevant timing information may also be gleaned from these signals, such as start of current flow, rise of current flow, end of current flow, and the like.

Nevertheless, a resistor 152 (which may be the current sense resistor 132) may be left in circuit and used "passively" for overcurrent protection, or more "actively" as a second current sense device for overcurrent protection. As indicated by the dashed line 153, this resistor 152 can provide a current sense signal (in the manner of 132) which can be used as a separate input to the DSP to act as protection in the event of excessive current demand. This may occur, for example, if the laser was to fail by reduced light output as the current would increase to compensate.

If the diode driver is used to pump a Q switched laser and the single short pulse output of the pumped laser is detected with a photodetector and this timing information is fed back to the DSP, the current pulse may be truncated to save energy and improve reliability. The DSP can shut down the current at the time of the short pulse and/or scale back the power supply voltage and/or current and/or pulse width to optimize the overall efficiency. The diode driver may be used to pump a non electro-optically Q switched laser and the current may be increased at a predetermined time to enhance the probability of the laser firing within a predetermined desired time bracket.

Size Reduction Method for High Current Pulses.

To provide high current pulses it is desirable not to draw the instantaneous power from the input power source because of high $i^2 R$ losses, and if the required energy is stored in a capacitor such as 102, then the power source need only support the average power, not the peak power. Hence, a battery power source can be smaller, or last longer (or both). Energy stored in a capacitor is $0.5 CV^2$ where C is the capacitance value and V is the charge voltage. It is clear that because of the $V^2$ function it is more space efficient to store a desired energy at a high voltage. Looking up the sizes and voltage ratings from data sheets of real capacitors confirms this. However, it is not desirable to store high voltage in the storage capacitor 102 as the dissipation in the current control device 134 would be excessive.

Figure 3:
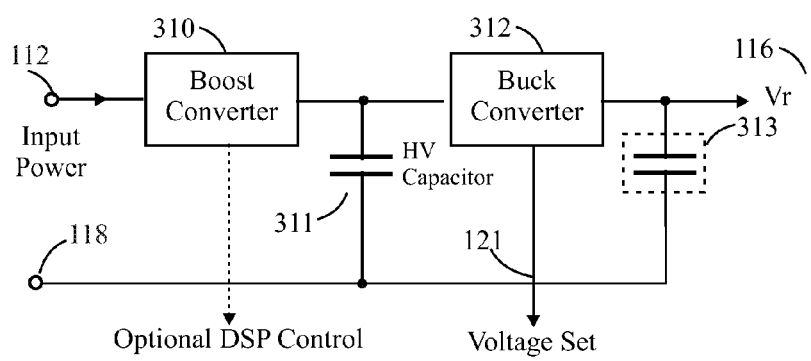
FIG. 3 is a partial (not complete) diagram of an alternate embodiment of a smart Laser Diode Driver, according to the invention.

An alternate embodiment for the smart diode driver of FIG. 1 is shown in FIG. 3, particularly using a boost converter 310 and buck converter 312 for the programmable power supply (110) discussed above. Some other elements are the same, and some are omitted, for illustrative clarity.

As illustrated by FIG. 3, as a part of the smart diode driver, the input voltage may be converted to an intermediate higher voltage using a standard power supply technology such as a boost or flyback converter 310, and may be stored in a high voltage storage capacitor 311 as a part of the programmable power supply. The boost converter 310 may optionally be controlled by the smart DSP (120) to adjust the charging rate or voltage, to switch on and off, or for built in test monitoring.

A second part of the alternative programmable power supply is a buck converter 312, as is known in prior art, to reduce the high voltage to the desired programmable value for the linear current source bank voltage Vr. The buck converter duty cycle is controlled internally or by the DSP to allow the HV storage capacitor 311 to discharge efficiently into the capacitor 313 via the buck converter (or regulator). By this means energy may be stored at a higher voltage (in capacitor 311) to reduce the overall size. The boost converter 310 may operate at the average power required, but the buck converter 312 must operate at a typically higher power level to keep the storage capacitor 102 topped up during the diode current draw. Because of the higher voltage source, the duty cycle of the buck converter 312 is low. Information on a buck converter is available at Wikipedia. http://en.wikipedia.org/wiki/Buck converter The capacitor 313 acts to smooth the current ramps from the buck converter 312 into a DC voltage (Vr), and the linear current source formed by the current sense device, current control device, and controller acts to control and regulate the current to the laser diode load 130, as described above. The ripple on capacitor 313 is not critical as long as the minimum required voltage to operate the current source is maintained. Capacitor 313 is not the primary storage element in this configuration, but acts to provide a sufficiently smooth supply to the current source. The feedback operation of the current source acts to provide a smooth current waveform.

The boost converter 310, buck converter 312 and HV capacitor 311 replace (or serve as) the power supply (110) and may also replace the storage function of the storage capacitor 102, the counterpart of which (i.e., the capacitor 313) only needs to function as a smoothing capacitor for the buck converter 312. This approach reduces the losses due to the storage capacitor 311 ESR as the losses are a lower percentage at a higher voltage, and the buck converter 312 may top up the Vr smoothing capacitor 313 working in a continuous mode.

In these examples, the HV storage capacitor 311 operates at a higher voltage (from the boost converter 310) than the storage capacitor 102 (operating at Vr). Some exemplary values for the various capacitors discussed herein are:

for the storage capacitor 102: 10,000 microfarads at 12 volts operating.

for the HV storage capacitor 311: 400 microfarads at 60 volts operating, for the smoothing capacitor 313: 400 microfarads at 12 volts operating.

The DSP 120 can control the charging rate of the programmable power supply 110 or boost converter 310 to minimize input current to match the repetition rate and energy requirements. This is useful to maximize battery life and minimize battery size.

The invention has been illustrated and described in a manner that should be considered as exemplary rather than restrictive in character—it being understood that only preferred embodiments have been shown and described, and that all changes and modifications that come within the spirit of the invention are desired to be protected. Other variations on the techniques set forth hereinabove may occur to one having ordinary skill in the art to which the present invention most nearly pertains, and such variations are intended to be within the scope of the invention, as disclosed and claimed herein.

What is claimed is:

1. Method of operating a load which is laser or light emitting diodes in a pulse mode with a diode driver comprising:
   providing a storage capacitor;
   providing a power supply receiving input power and providing output power for charging the storage capacitor to a capacitor bank voltage (Vr);
   providing a current sense device, having an output providing a current sense signal indicative of a current flowing through the load;
   providing a current control device for controlling the current flowing through the load in response to a current control signal;
   providing a controller having inputs for capacitor bank voltage (Vr) and the current sense signal, and outputting the current control signal, and the controller further has a voltage set output for setting the bank voltage (Vr) output by the power supply;

with the controller, adjusting the power supply voltage to ensure minimum voltage across the current control device at the end of a pulse and minimize its dissipation; and measuring temperature of the load and providing a signal to the controller to make a feed-forward adjustment to allow a more rapid setting of a correct voltage with lower instantaneous peak power in the current control device.

2. The method of claim 1, further comprising:
generating at least one precursor pulse or pulses to determine a correct initial storage capacitor bank voltage (Vr).

3. The method of claim 1, further comprising:
storing conditions of a last, prior, or test pulses to allow a rapid setting of the correct capacitor bank voltage (Vr).

4. The method of claim 1, wherein the laser is a Q switched laser and further comprising:
detecting a single short pulse output of the laser with a photodiode, and feeding information about the pulse back to the controller.

5. The method of claim 4, further comprising:
shutting down the current flowing through the load at the time of the short pulse.

6. The method of claim 4, further comprising:
scaling back one or more of the power supply voltage and current and pulse width to optimize the overall efficiency.

7. The method of claim 1, further comprising:
the diode driver is used to pump a non electro-optically Q switched laser and the current is increased at a predetermined time to enhance the probability of the laser firing within a predetermined desired time bracket.

8. A driver for providing pulsed power to a load comprising laser diodes or LEDs, the driver comprising:
a storage capacitor that provides the primary energy for the pulse;

a power supply receiving input power and providing output power for charging the storage capacitor to a predetermined capacitor bank voltage (Vr);

a current sense device, having an output providing a current sense signal indicative of a current flowing through the load;

a current control device for controlling the current flowing through the load in response to a current control signal (Control V); and a controller having inputs for the capacitor bank voltage (Vr) and the current sense signal, and outputting the current control signal, and the controller further has an output (voltage set) for adjusting the power supply voltage to ensure minimum voltage across the current control device at the end of a pulse and minimize its dissipation;

further comprising:

a temperature sensor for measuring temperature and providing a signal to the controller to make a feed-forward adjustment to allow a more rapid setting of a correct voltage with lower instantaneous peak power in the current control device.

9. The driver of claim 8, wherein:
the current sense device comprises a resistor connected between the load and ground.

10. The driver of claim 8, wherein:
the controller includes a digital signal processor (DSP).

11. The driver of claim 8, wherein:
the current control device comprises a FET.

12. The driver of claim 8, wherein:
the load is connected to the storage capacitor;
the current sense device is connected to ground; and
the current control device is connected between the load and the current sense device.

13. The driver of claim 8, wherein:
the power supply is a programmable power supply.

14. The driver of claim 8, wherein:
the current sense device comprises a photodetector detecting light emitted by the load.

15. The driver of claim 8, wherein the power supply comprises:
a boost converter for boosting input voltage to a voltage higher than input power;
a high voltage capacitor for storing the high voltage; and
a buck converter for charging the storage capacitor.

16. The driver of claim 8, wherein:
the controller includes a digital signal processor (DSP);
the controller includes a boost converter and a buck converter; and
the DSP is used to control switching of the power supply, including the boost converter and the buck converter.

17. The driver of claim 8, wherein:
the controller includes a digital signal processor (DSP); and
the DSP is used for setting current, pulse width and pulse repetition frequency for the load.

* * * * *